(12) United States Patent
Takatori

(10) Patent No.: US 7,956,632 B2
(45) Date of Patent: Jun. 7, 2011

(54) SOCKET, MODULE BOARD, AND INSPECTION SYSTEM USING THE MODULE BOARD

(75) Inventor: Masahiro Takatori, Osaka (JP)

(73) Assignee: Panasonic Corporation, Osaka (JP)

( * ) Notice: Subject to any disclaimer, the term of this patent is extended or adjusted under 35 U.S.C. 154(b) by 131 days.

(21) Appl. No.: 12/440,937

(22) PCT Filed: Sep. 18, 2007

(86) PCT No.: PCT/JP2007/068037
§ 371 (c)(1),
(2), (4) Date: Mar. 12, 2009

(87) PCT Pub. No.: WO2008/035650
PCT Pub. Date: Mar. 27, 2008

(65) Prior Publication Data
US 2010/0097085 A1    Apr. 22, 2010

(30) Foreign Application Priority Data
Sep. 19, 2006 (JP) .................. 2006-252061

(51) Int. Cl.
*G01R 31/02* (2006.01)
(52) U.S. Cl. .................. 324/756.02
(58) Field of Classification Search .......... None
See application file for complete search history.

(56) References Cited

U.S. PATENT DOCUMENTS

| | | | | |
|---|---|---|---|---|
| 5,807,104 | A * | 9/1998 | Ikeya et al. | 324/756.02 |
| 6,181,149 | B1 * | 1/2001 | Godfrey et al. | 324/750.19 |
| 6,270,356 | B1 * | 8/2001 | Hoshino et al. | 439/70 |
| 6,614,247 | B2 * | 9/2003 | Ikeya et al. | 324/756.02 |
| 6,819,127 | B1 * | 11/2004 | Hembree | 324/750.25 |
| 7,064,567 | B2 * | 6/2006 | Schott et al. | 324/756.02 |
| 7,187,189 | B2 * | 3/2007 | Lopez et al. | 324/760 |
| 7,482,825 | B2 * | 1/2009 | Lopez et al. | 324/760 |
| 7,514,946 | B2 * | 4/2009 | Soeta et al. | 324/760 |
| 2003/0076123 | A1 * | 4/2003 | Ikeya et al. | 324/755 |
| 2006/0033512 | A1 * | 2/2006 | Schott et al. | 324/754 |

FOREIGN PATENT DOCUMENTS

JP          1-173637 A      7/1989
(Continued)

OTHER PUBLICATIONS

Translation of NEC Corp Patent JP 2001-264383 A, Publication Date Sep. 26, 2001.*
International Search Report for Application No. PCT/JP2007/068037, Jan. 8, 2008, Panasonic Corporation.
JP Office Action for 2008-535343, Jan. 18, 2011, pp. 1 and 3.

*Primary Examiner* — Jermele M Hollington
(74) *Attorney, Agent, or Firm* — RatnerPrestia

(57) ABSTRACT

The socket of the present invention includes a lid having a first protrusion on the reverse side, and a first terminal connected electrically to the first protrusion, and a main body having a second terminal on the upside, and a third terminal connected electrically to the second terminal on the reverse side, in which an electronic component is contained in the main body, and the first terminal and the second terminal are connected electrically in the space enclosed and fixed by the lid. The inspection system of the present invention includes a socket of the present invention, and an evaluation board for connecting a third terminal of the socket electrically to the inspection apparatus of the electronic component, and propagating an inspection signal.

8 Claims, 11 Drawing Sheets

FOREIGN PATENT DOCUMENTS

| JP | 01-173637 A | 7/1989 |
| JP | 08-031532 A | 2/1996 |
| JP | 2000-068440 A | 3/2000 |
| JP | 2001-264383 A | 9/2001 |

* cited by examiner

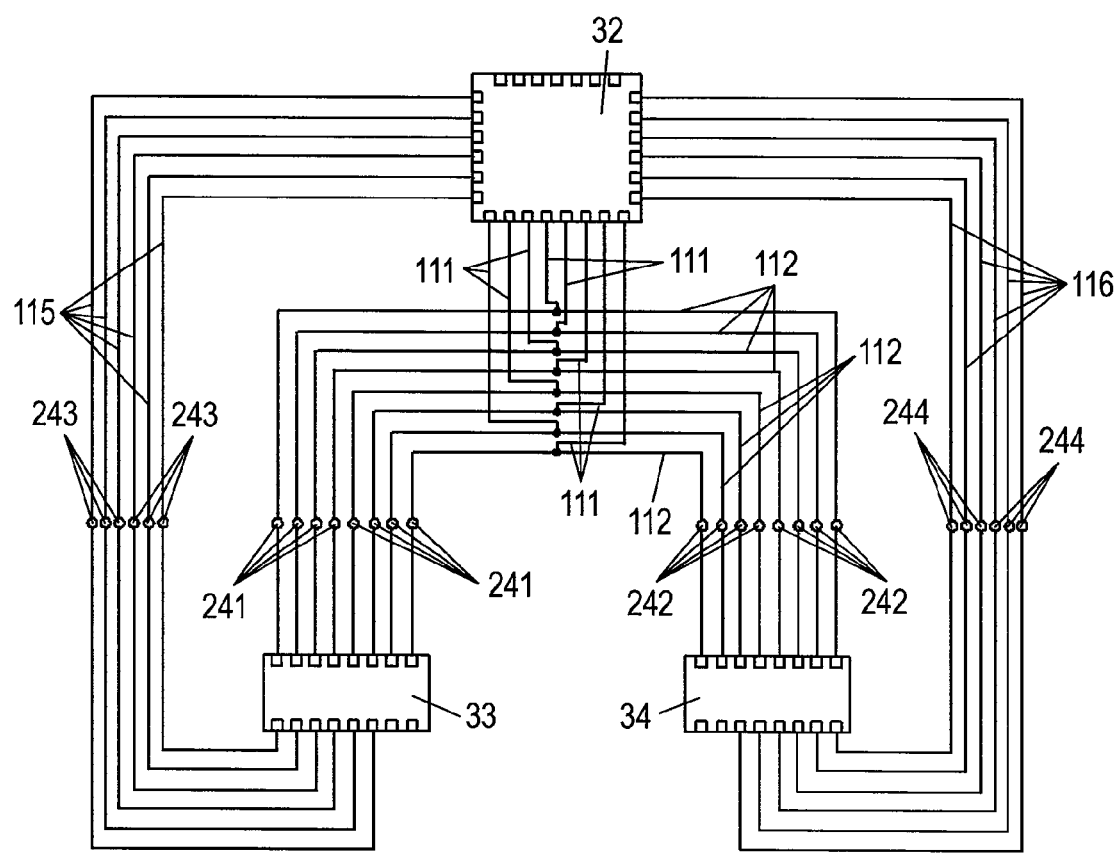

SOCKET, MODULE BOARD, AND INSPECTION SYSTEM USING THE MODULE BOARD

This Application is a U.S. National Phase Application of PCT International Application PCT/JP2007/068037.

TECHNICAL FIELD

The present invention relates to module board on which an LSI (large scale integrated circuit), an IC (integrated circuit), or other electronic components are mounted, a socket for storing a module board, and a system for inspecting electronic components.

BACKGROUND ART

Recently, digital television sets and other digital electric appliances are conquering the general household. The popularity of digital electric household appliances depends on high performance and multiple functions of the products.

The performance of digital electric household appliances is enhanced by increasing the speed of digital signal processing. The enhancement of speed of digital signal processing is realized by increase of clock frequency of system LSI, extension of data bus width, and use of high-speed memory such as DDR (double data rate) memory.

To increase the functions of digital electric household appliances, higher integration of circuits is needed. The integration of circuits may be enhanced by assembling a plurality of electronic components in one package by the technology of, for example, MCM (multi-chip module), SIP (system-in-package), or POP (package-on-package).

With an advanced integration of a circuit, multiple functions can be incorporated in a product, but the number of interface signals for operating the functions also increases. As a result, the number of external terminals provided outside of the package increases. In addition, along with the increase in the number of electronic components contained in the package, the number of external terminals for their inspection increases. Such package is connected electrically to the external board through external terminals, but the number of external terminals increases, and the package increases in size. The board of a digital electric household appliance for mounting the package increases in size as the package size increases, and the digital electric household appliance itself increases in size.

In the IC package in patent document 1, a lower stage lead wire is provided in a first layer of a two-layer lead board, and an upper stage lead terminal is provided in a second layer as a terminal for test. In this configuration, the upper stage lead terminal provided in the second layer of the lead board is not connected to the circuit board. That is, the terminal for test is provided in the second layer of the lead board, and the number of terminals provided in a region connected to the circuit board (the first layer of the lead board) is curtailed. As a result, the size of the IC package is reduced.

When inspecting and shipping the electronic components contained in the package, they are generally inspected after the package assembly is completed. Hence, generally, the package must be detachably connected to the inspection apparatus. In the socket disclosed in patent document 2, the pin contact opposite to the solder ball in the lower part of BGA package, and the socket contact opposite to this pin contact are contained in the socket main body. Then, the BGA package and the board are detachable.

However, in the configuration of the IC package disclosed in patent document 1, the lead board is formed in two layers for forming the terminal for test. In this case, by forming the board not necessary as the function for the electronic component, the manufacturing cost and the number of manufacturing processes increases.

Besides, since the terminal for test is formed in the lead board of the second layer, the length of the wire for connecting the terminal for test and the IC chip becomes longer. In this case, it is hard to match the impedance between the terminal for test and the IC chip. As a result, when inspecting the IC chip, a reflection wave is generated at the terminal for test or the wire end, and a waveform distortion may be included in the inspection signal. It is hence difficult to inspect the IC chip precisely.

When the socket in patent document 2 and the IC package in patent document 1 are combined, the terminal for test and the pin contact cannot be connected electrically. Hence, the inspection apparatus and the terminal for test cannot be connected, and the electronic component in the inside of the IC package cannot be inspected.

[Patent document 1] Unexamined Japanese Patent Publication No. 2000-68440
[Patent document 2] Unexamined Japanese Patent Publication No. H8-31532

DISCLOSURE OF THE INVENTION

The present invention presents a small-sized module board, a socket and module board, and an inspection system capable of inspecting an electronic component securely, and no increase in the manufacturing cost.

According to the present invention, when forming a terminal for test on a module board, the terminal for test and the inspection apparatus can be connected electrically, and the electronic component inside the module board can be inspected.

A socket includes a lid having a first protrusion on its reverse side, and a first terminal connected electrically to the first protrusion, and a main body having a second terminal on its upside, and a third terminal connected electrically to the second terminal on its reverse side, and an electronic component is contained in the main body, and the first terminal and the second terminal area connected electrically in a space enclosed and fixed by the lid.

A module board includes a plurality of circuit boards laminated in a vertical direction and having individual wiring patterns, an electronic component mounted on at least one circuit board of the plurality of circuit board and connected electrically to the wiring patterns, a sixth terminal provided at a downside of the lowest circuit board of the plurality of circuit boards, and connected electrically to the wiring patterns, and a seventh terminal exposed on an upside of the highest circuit board of the plurality of circuit boards, and connected electrically to the wiring patterns, and the seventh terminal is a terminal for inspection of the electronic component, and also serves as a connection terminal for laminating a second module board.

An inspection system includes a socket, an inspection apparatus for inspecting the electronic component, and an evaluation board for connecting the third terminal and fifth terminal of the socket electrically to the inspection apparatus for propagating an inspection signal.

An inspection system includes a socket, a module board, an inspection apparatus for inspecting the electronic component, and an evaluation board for evaluating the electronic component, and a first protrusion of the socket is connected electrically to the seventh terminal of the module board, the fourth terminal of the socket is connected electrically to the sixth terminal of the module board, the third terminal and fifth terminal of the socket are connected electrically to the inspection apparatus, and the evaluation board propagates an inspection signal.

BRIEF DESCRIPTION OF THE DRAWINGS

FIG. 11 is a schematic diagram of the module board and a wiring pattern formed on the laminated module board.

DESCRIPTION OF REFERENCE NUMERALS

Figure 1:
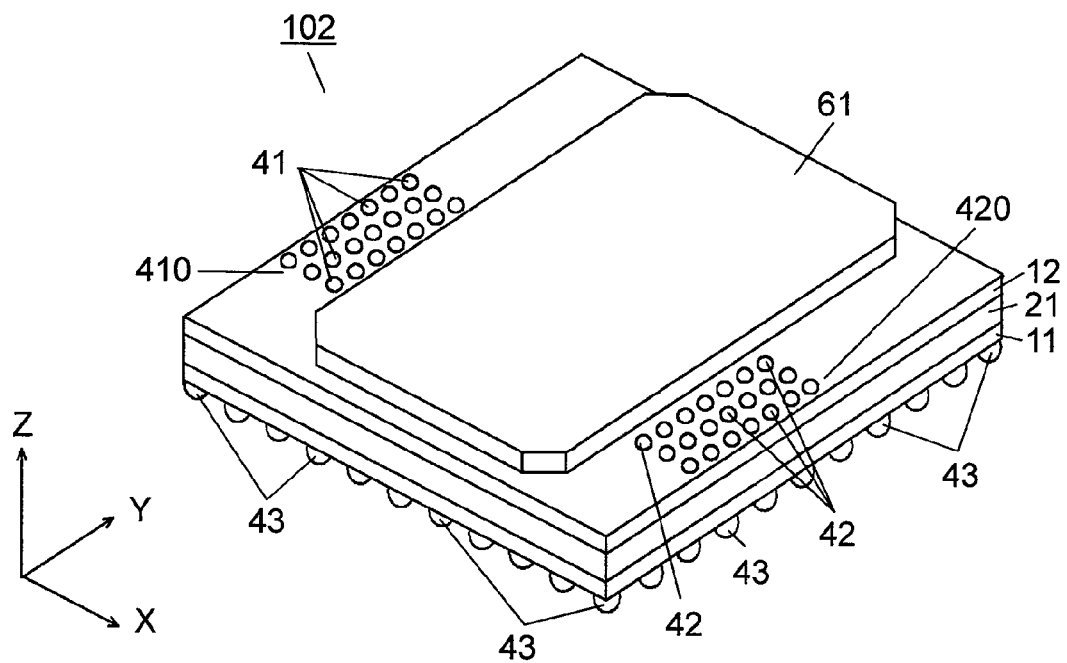
FIG. 1 is a perspective outline view of a module board in preferred embodiment 1.

11 First circuit board
12 Second circuit board
21 First composite sheet
41, 42, 241, 242, 243, 244 Terminal for inspection
43, 343 Solder ball
102, 233, 234 Module board
111, 112, 113, 114, 115, 116 Wiring pattern
410 First inspection part
411, 412, 421, 422 Via
420 Second inspection part
500 Wiring board
501 Socket
502 Lid
503, 517 Male terminal
504, 506 Pin contact
505, 507 Wiring
508 Support plate
509, 520 Holding plate
510 Main body
511, 515 Female terminal
512, 514, 516 Solder ball
513 Contact terminal
527 Forming part
518 Through-hole
519 Hole

PREFERRED EMBODIMENTS FOR CARRYING OUT THE INVENTION

The best mode for carrying out the present invention is described below while referring to the accompanying drawings.

Preferred Embodiment 1

Preferred embodiment 1 of the present invention is explained by referring to the drawings.

FIG. 1 is a perspective outline view of a module board in preferred embodiment 1. In FIG. 1, to clarify the relation of positions, arrows are shown to indicate mutually orthogonal X-direction, Y-direction, and Z-direction. Specifically, the X-direction and the Y-direction are mutually orthogonal in a horizontal plane, and the Z-direction corresponds to the perpendicular direction. The same arrows indicating the X-direction, Y-direction, and Z-direction are shown in FIG. 2A, FIG. 2B, FIG. 4, FIG. 5A, FIG. 5B, FIG. 6A, and FIG. 6B.

As shown in FIG. 1, module board 102 in preferred embodiment 1 has a laminated structure sequentially stacking up first circuit board 11 (or first board 11), first composite sheet 21, and second circuit board 12 (or second board 12). On the upside of second board 12, mold part 61 is formed as a sealing layer. First board 11 and second board 12 may be either a multi-layer board or a single-layer board. First composite sheet 21 may be an adhesive sheet containing an epoxy resin. For example, pre-preg may be used. First composite sheet 21 functions as an insulating layer.

First inspection part 410 and second inspection part 420 are provided in a specified region along two sides in the Y-direction on the upside of second board 12. A plurality of terminals for inspection 41 and a plurality of terminals for inspection 42 are disposed in matrix on first inspection part 410 and second inspection part 420.

Terminals for inspection 41 and 42 are connected electrically to LSI or other electronic component mounted on first board 11 by way of wiring patterns. Terminals for inspection 41 and 42 may be, for example, lands or vias. Inspection apparatus 603 is connected to terminals for inspection 41 and 42 by way of socket 501 described below.

A plurality of solder balls 43 is formed in the downside of first board 11. Solder balls 43 are connected electrically to the electronic component mounted on first board 11.

Module board 102 is mounted on external board 201 described below by soldering by using solder balls 43. As a result, external board 201 and the electronic component mounted on module board 102 are connected electrically. Module board 102 is mounted on external board 202 by, for example, reflow soldering method.

Although the detail is described later, since terminals for inspection 41 and 42 are not connected to external board 202, it is not necessary to connect by reflow soldering. Hence, terminals for inspection 41 and 42 may be small enough to contact with pin contacts 504 and 506 of socket 501 described below. In this case, terminals for inspection 41 and 42 may be sufficiently reduced in size, and pitches of terminal for inspection 41, and pitches of terminal for inspection 42 may be sufficiently smaller.

Therefore, the size of terminals for inspection 41 and 42 is sufficiently smaller than the size of solder balls 43. At the same time, the pitches of terminal for inspection 41, and pitches of terminal for inspection 42 may be sufficiently smaller than the pitches of solder balls 43.

For example, the size of solder balls 43 is about 650 μm, and the size of terminals for inspection 41 and 42 is about 100 μm. For example, the pitches of solder balls 43 are 1 mm, and the pitches of terminals for inspection 41 are 150 μm.

In this case, first circuit board 11 or second circuit board 12 is not increased in size, and module board 102 can be reduced in size.

Examples of module board 102 include LSI, IC, MCM, SIP, and others.

An internal structure of module board 102 is specifically described below.

Figure 2A:
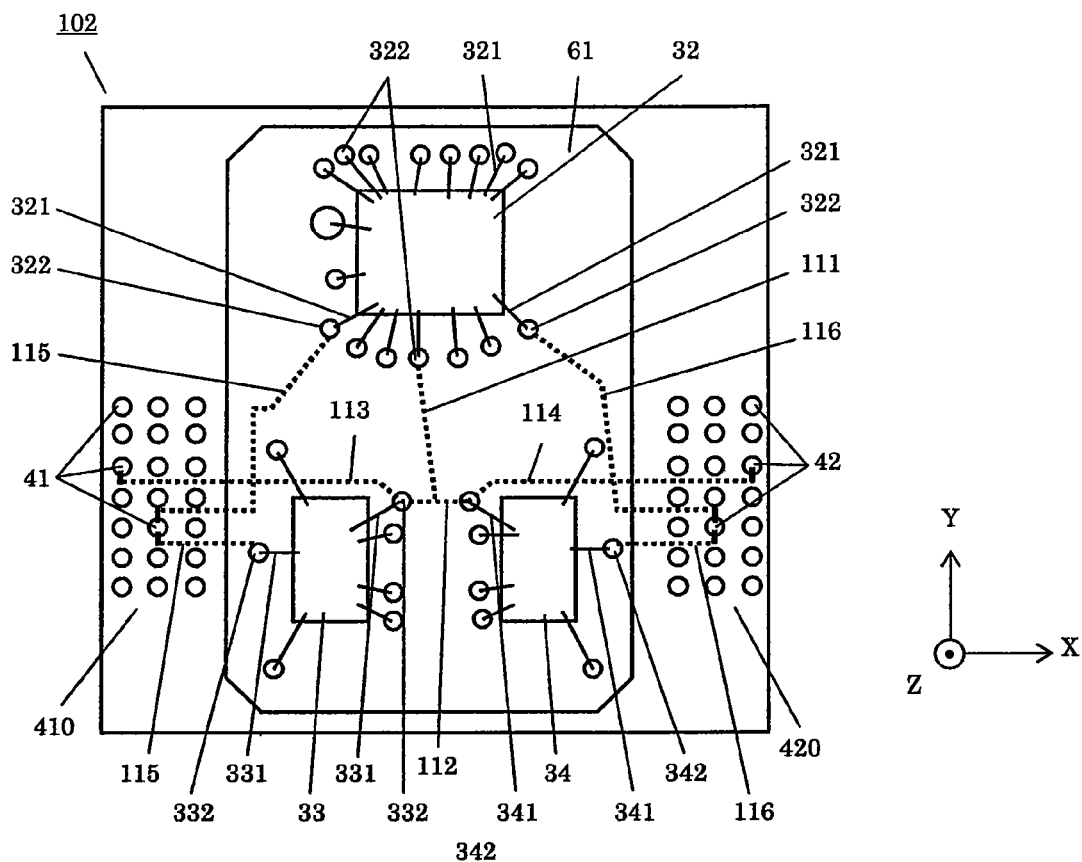
FIG. 2A is a diagram explaining an internal structure of the module board.
Figure 2B:
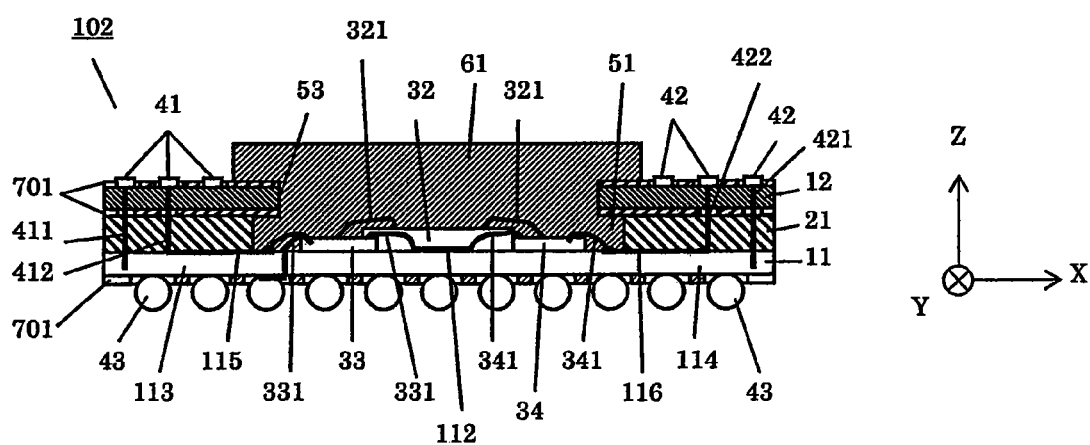
FIG. 2B is a sectional view explaining an internal structure of the module board.

FIG. 2A shows a configuration of a plurality of electronic components mounted on module board 102 on XY plane. FIG. 2B is a sectional view of module board 102.

As shown in FIG. 2B, in the center of first composite sheet 21, space 51 penetrating from top to bottom is formed. In space 51, LSI (large scale integrated circuit) 32, memory 33, and memory 34 are mounted on first board 11. Memories 33 and 34 are work memories functioning as work regions of LSI 32. As memories 33 and 34, for example, DDR (double data rate) memories may be used. In this case, a high-frequency signal of 400 MHz or more can be transferred between LSI 32 and memories 33 and 34.

As shown in FIG. 2B, in a specified region in the center of second board 12, hole 53 is formed. As shown in FIG. 1 and FIG. 2B, mold part 61 is formed as a sealing layer for sealing the inside of space 51 and hole 53. As a result, LSI 32 and memories 33 and 34 can be protected from external effects, and damage and deterioration can be prevented. Mold part 61 is formed of, for example, a resin material.

LSI 32 and memories 33 and 34 are adhered on first board 11 by way of an adhesive sheet (not shown) of thickness of, for example, several micrometers. Or LSI 32 and memories 33 and 34 are connected electrically to first board 11, for example, by wire bonding process or flip chip process.

By wire bonding process or flip chip process, the height of LSI 32 and memories 33 and 34 on first board 11 may be suppressed to be low. As a result, the thickness of first composite sheet 21 may be reduced, and module board 102 may be formed in a thin size.

In FIG. 2A and FIG. 2B, LSI 32 and memories 33 and 34 are connected electrically to the wiring patterns on first board 11 by wire bonding process.

As LSI 32 and memories 33 and 34, for example, bare die or CSP (chip size package) polished or diced to a specified size may be used. The thickness of first composite sheet 21 is preferred to be larger than the thickness of the bare die or CSP, and is, for example, 500 μm to 800 μm.

As shown in FIG. 2B, not shown in FIG. 1, earth conductor layer 701 (or ECL 701) is formed on the downside of first board 11 and on the upside and downside of second board 12.

On the downside of first board 11, ECL 701 is formed in a region excluding the forming region of solder balls 43. On the upside of second board 12, ECL 701 is formed in a region excluding the forming region of terminals for inspection 41 and 42, and the forming region of wiring patterns (not shown). On the downside of second board 12, ECL 701 is formed in a region excluding the forming regions of vias 411, 412, 421, and 422 described below. ECL 701 is preferably formed in a wide region as far as possible so as to avoid contact with solder ball 43, terminal for inspection 41 and 42, wring patterns and vias 411, 412, 421, and 422. The effect of ECL 701 is described later.

Figure 3:
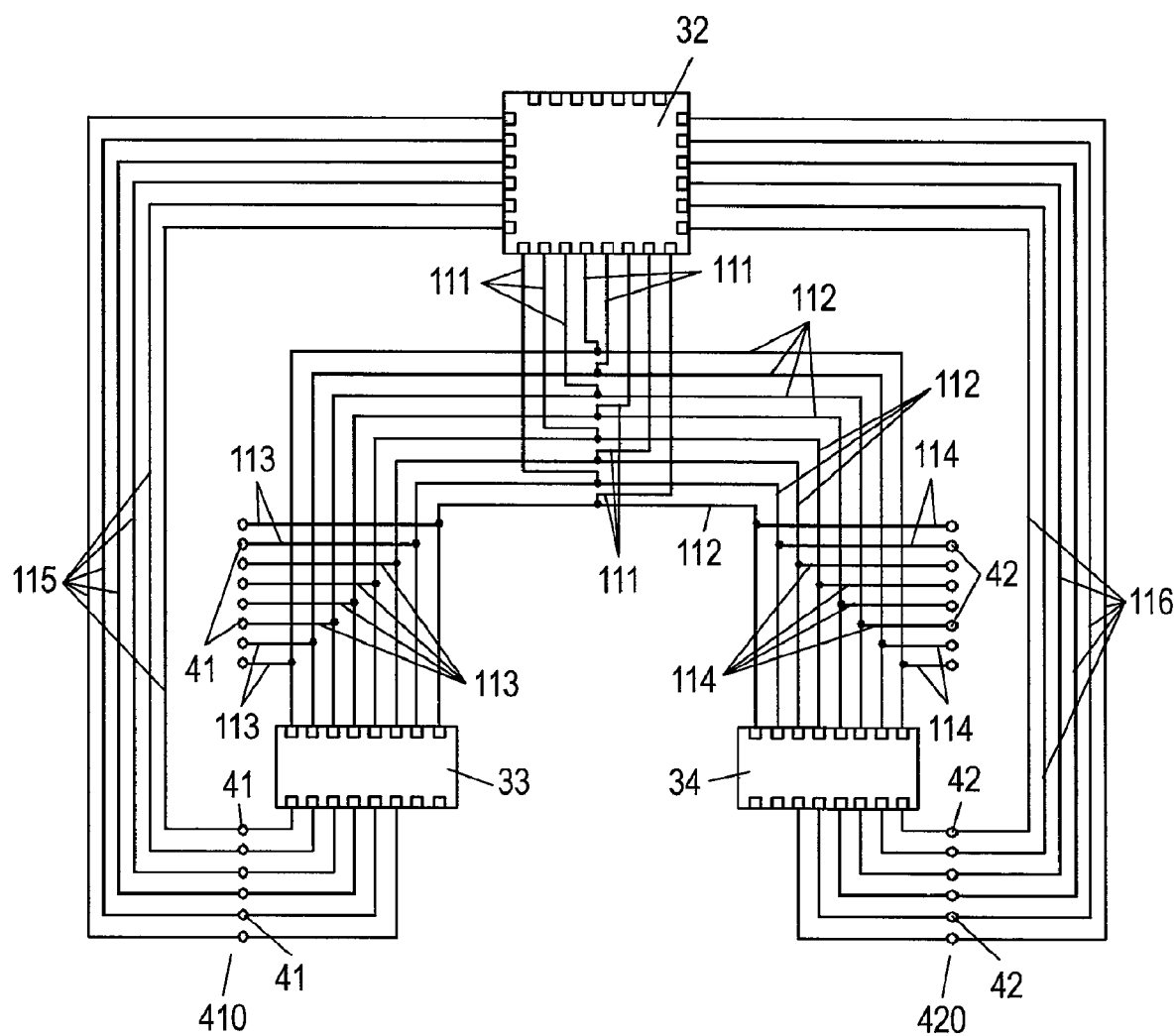
FIG. 3 is a schematic diagram of a wiring pattern formed in a first board.

Referring further to FIG. 3, the wiring of LSI 32 and memories 33 and 34, and terminals for inspection 41 and 42 are described below.

FIG. 3 is a schematic diagram of wiring patterns 111 to 116 formed in first circuit board 11. In FIG. 2, wiring patterns 111 to 116 are represented by one pattern each, but actually wiring patterns 111 to 116 are formed in a plurality each. Similarly, vias 411, 412, 421, and 422 described later are represented by one each, but actually vias 411, 412, 421, and 422 are formed in a plurality each.

As shown in FIG. 3, one end of a plurality of wiring patterns 111 is connected electrically to each one of a plurality of terminals of LSI 32 by way of a plurality of bonding pads 322 (see FIG. 2A) and a plurality of wires 321 (see FIG. 2A). Other end of the plurality of wiring patterns 111 is connected individually to the center of the plurality of wiring patterns 112.

One end of the plurality of wiring patterns 112 is connected electrically to each one of a plurality of terminals of memory 33 by way of bonding pad 332 (see FIG. 2A) and wire 331 (see FIG. 2A). Other end of the plurality of wiring patterns 112 is connected electrically to each one of a plurality of terminals of memory 34 by way of bonding pad 342 (see FIG. 2A) and wire 341 (see FIG. 2A).

As shown in FIG. 3, one end of the plurality of wiring patterns 113 is connected electrically to each one of a plurality of terminals for inspection 41 by way of via 411 (see FIG. 2B) near one side of Y-direction of module board 102 (see FIG. 2B). Other end of the plurality of wiring patterns 113 is connected to each one of the plurality of wiring patterns 112. Thus, wiring patterns 113 are stub wirings branched from wiring patterns 112. Thus, terminals for inspection 41 and wiring patterns 111 and 112 are connected electrically.

One end of the plurality of wiring patterns 114 is connected electrically to each one of a plurality of terminals for inspection 42 by way of via 421 (see FIG. 2B) near other side of Y-direction of module board 102 (see FIG. 2B). Other end of the plurality of wiring patterns 114 is connected to each one of the plurality of wiring patterns 112. Thus, wiring patterns 114 are stub wirings branched from wiring patterns 112. Thus, terminals for inspection 42 and wiring patterns 111 and 112 are connected electrically.

One end of the plurality of wiring patterns 115 is connected electrically to each one of a plurality of terminals of LSI 32 by way of bonding pad 322 (see FIG. 2A) and wire 321 (see FIG. 2A). Other end of the plurality of wiring patterns 115 is connected electrically to each one of the plurality of terminals of memory 33 by way of bonding pad 332 (see FIG. 2A) and wire 331 (see FIG. 2A).

The plurality of wiring patterns 115 is connected electrically to the plurality of terminals for inspection 41 by way of via 412 (see FIG. 2B) formed near other side of Y-direction of module board 102 (see FIG. 2B). Thus, terminals for inspection 41 and wiring patterns 115 are connected electrically.

One end of the plurality of wiring patterns 116 is connected electrically to each one of a plurality of terminals of LSI 32 by way of bonding pad 322 (see FIG. 2A) and wire 321 (see FIG. 2A). Other end of the plurality of wiring patterns 116 is connected electrically to each one of the plurality of terminals of memory 34 by way of bonding pad 342 (see FIG. 2A) and wire 341 (see FIG. 2A).

The plurality of wiring patterns 116 is connected electrically to the plurality of terminals for inspection 42 by way of via 422 (see FIG. 2B) formed near other side of Y-direction of module board 102 (see FIG. 2B). Thus, terminals for inspection 42 and wiring patterns 116 are connected electrically.

In this configuration, address signals and clock signals are transferred from LSI 32 to memories 33 and 34 by way of wiring patterns 111 and 112. Data signals are transferred between LSI 32 and memories 33 and 34 by way of wiring patterns 115 and 116.

Herein, wiring patterns 111 112, 115, and 116 are wirings not necessary functionally except for connecting with LSI 32 and memories 33 and 34. That is, the wirings for connecting LSI 32 and memories 33 and 34 are sufficiently realized in function only by wiring patterns 111 112, 115,116 for transferring the signals. Wiring patterns 111 112, 115, and 116 are isolated from the atmosphere by first composite sheet 21, second board 12, and mold part 61. That is, LSI 32 and memories 33 and 34 and wiring patterns 111 112, 115, and 116 are sealed in module board 102.

To inspect the waveform and pattern of signals transferred from LSI 32 to memories 33 and 34, it is necessary to connect inspection apparatus 603 described below to wiring patterns 111 112, 115, and 116 sealed in module board 102. To inspect the internal circuits of LSI 32 and memories 33 and 34, it is necessary to feed inspection signals from inspection apparatus 603 outside of module circuit 102 into LSI 32 and memories 33 and 34, and match the signals issued from LSI 32 and memories 33 and 34 with expected values.

In preferred embodiment 1, as shown in FIG. 2 and FIG. 3, terminals for inspection 41 are connected to wiring patterns 111 and 112 electrically. Hence, by connecting inspection apparatus 603 to terminals for inspection 41, the waveform and pattern of address signals and clock signal transferred from LSI 32 to memory 33 can be inspected.

Moreover, terminals for inspection 42 are connected to wiring patterns 111 and 112 electrically. Hence, by connecting inspection apparatus 603 to terminals for inspection 42, the waveform and pattern of address signals and clock signals transferred from LSI 32 to memory 34 can be inspected.

Terminals for inspection 41 and wiring patterns 115 connected electrically. Hence, by connecting inspection apparatus 603 to terminals for inspection 41, the waveform and pattern of data signals transferred between LSI 32 and memory 33 can be inspected.

Terminals for inspection 42 and wiring patterns 116 connected electrically. Hence, by connecting inspection apparatus 603 to terminals for inspection 42, the waveform and pattern of data signals transferred between LSI 32 and memory 34 can be inspected.

When inspecting the internal circuits of LSI 32 and memories 33 and 34, terminals for inspection 41 and 42 and inspection apparatus 603 are connected, and inspection signals are fed into terminals for inspection 41 and 42, and output signals from terminals for inspection 41 and 42 can be matched with expected values.

In preferred embodiment 1, common address signal and clock signal issued from LSI 32 are branched in two directions from wiring pattern 111 to wiring patter 112, and are respectively put into memories 33 and 34.

In this case, for example in FIG. 3, when six-bit data signals are transferred from LSI 32 to memories 33 and 34, six-bit data signals are stored individually in storage regions specified by the common address signal in memories 33 and 34. Therefore, by using the address signal and clock signal common for memories 33 and 34, data signals of a total of twelve bits can be read and written. That is, the number of bits of data signal processed by LSI 32 can be expanded by two times. As a result, by using the memory of low cost, the performance of module board 102 can be enhanced.

In preferred embodiment 1, meanwhile, wiring pattern 113 and wiring pattern 114 connected to same wiring pattern 112 are formed at equal length. Wiring pattern 111 is connected at a position for dividing wiring pattern 112 into two equal portions. Via 411 and via 421 are formed at equal length. Hence, the wiring length from the connection position to terminals for inspection 41 and the wiring length from the connection position to terminals for inspection 42 are equal to each other. Hence, generation of reflection waveform at terminals for inspection 41 of terminals for inspection 42 can be prevented, and generation of waveform distortion in signals of wiring patterns can be prevented.

As the terminals for inspection for inspecting the signals transferred to wiring patterns 111 and 112, in principle, one terminal is enough for a set of wiring patterns 111 and 112 to be coupled. However, when one stub wiring is distributed from wiring patterns 111 or wiring patterns 112, and the stub wiring is connected to the terminals for inspection, reflection wave occurs at the terminals for inspection, and waveform distortion occurs in the signal.

In preferred embodiment 1, therefore, by two wiring patterns 113 and 114 branched from each wiring pattern 112, two terminals for inspection 41 and 42 are connected in every one set of coupled wiring patterns 111 and 112. The length of wiring pattern 113 and the length of wiring pattern 114 branched off from same wiring pattern 112 are set to be equal to each other. Further, wiring pattern 111 is connected at a position for dividing wiring pattern 112 into two equal portions. It is hence effective to prevent generation of reflection wave at terminals for inspection 41 and terminals for inspection 42. As a result, generation of waveform distortion in address signal and clock signal can be prevented.

Meanwhile, wiring patterns 113 and 114 may be also branched off from wiring pattern 111, instead of wiring pattern 112.

The number of memories connected to LSI 32 is not limited to two, but three or more memories may be connected in parallel, or one memory may be used. If three or more memories are connected, the number of bits of data signal to be processed by LSI 32 may be further extended.

In the configuration shown in FIG. 3, the wiring pattern connected to LSI 32 is branched in two directions, but when three or more memories are connected, the wiring pattern is formed so that the wiring pattern connected to LSI 32 may be branched in the same number of directions as the number of memories. In this case, when connecting terminals for inspection to the individual branched wiring patterns, same as in the case above, it is preferred to form each wiring pattern so that the wiring length maybe equal from the branch point to each terminal for inspection. Hence, generation of reflection wave at each terminal for inspection can be prevented.

As mentioned above, in the downside of first circuit board 11 and in the upside and downside of second circuit board 12, ECL 701 is formed in a wide region as far as possible. Hence, LSI 32, memories 33 and 34, and wiring patterns 111 to 116 connected to them can be contained within ECL 701. In this case, ECL 701 prevents high-frequency noise radiated from LSI 32, memories 33 and 34, and wiring patterns 111 to 116 from leaking to outside of module board 102.

As mentioned above, the size of terminals for inspection 41 and 42 is sufficiently small. In this case, radiation of high-frequency noise from terminals for inspection 41 and 42 to outside of module board 102 can be prevented.

Hence, radiation of high-frequency noise from module board 102 can be securely prevented. As a result, malfunction of electronic appliances can be prevented.

Figure 4:
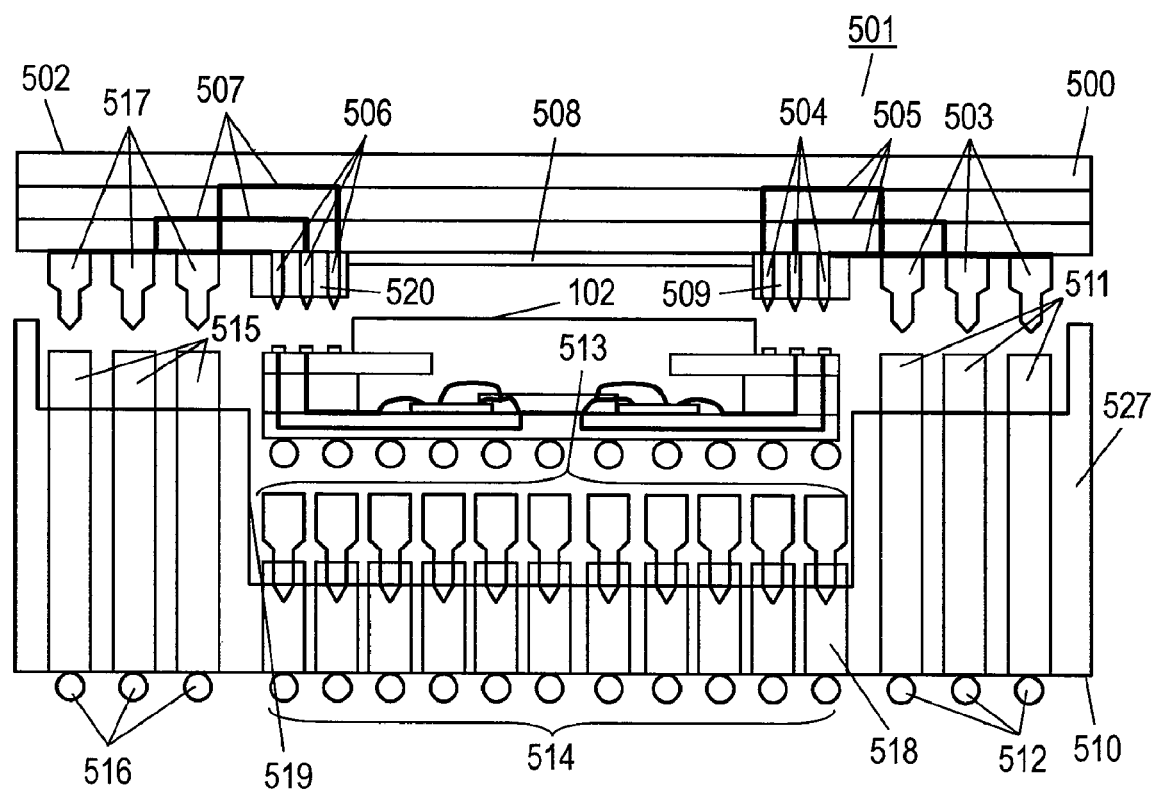
FIG. 4 is a sectional view explaining an internal structure of a socket.
Figure 4:
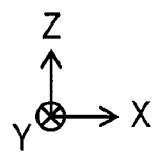
Figure 5A:
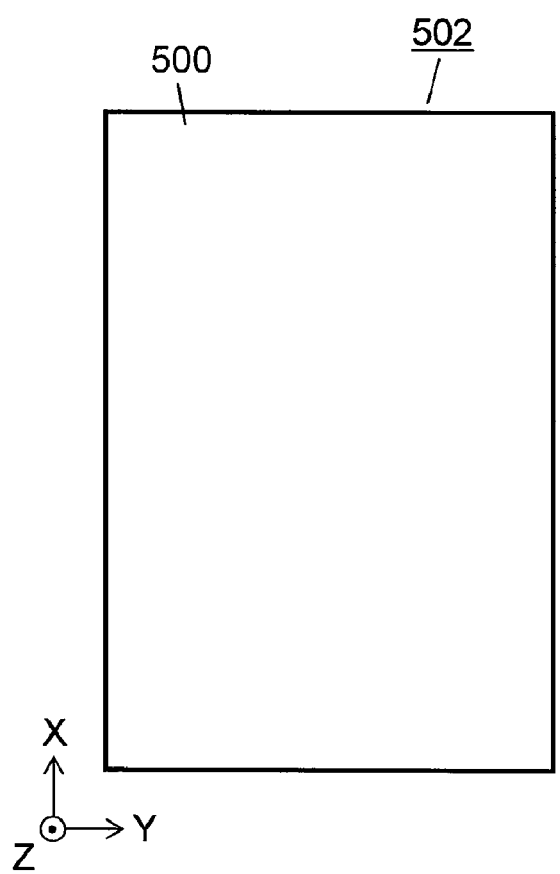
FIG. 5A is a top view of a lid of the socket.
Figure 5B:
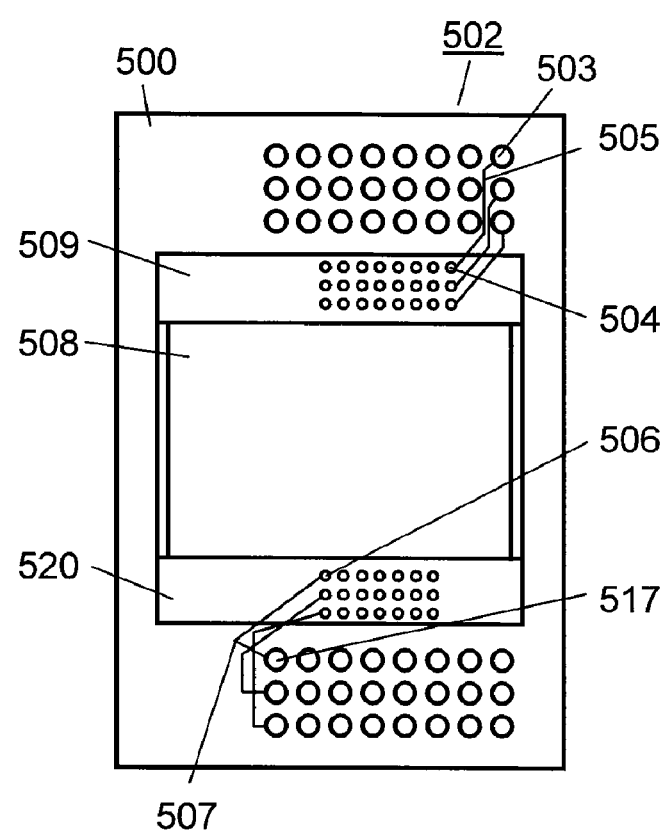
FIG. 5B is a rear view of a lid of the socket.
Figure 6A:
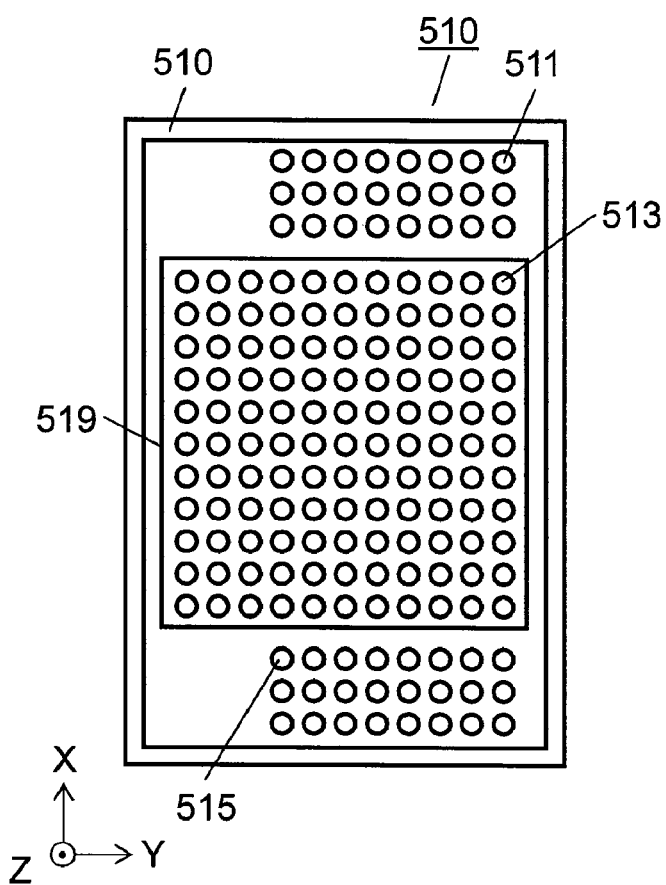
FIG. 6A is a top view of main body of the socket.
Figure 6B:
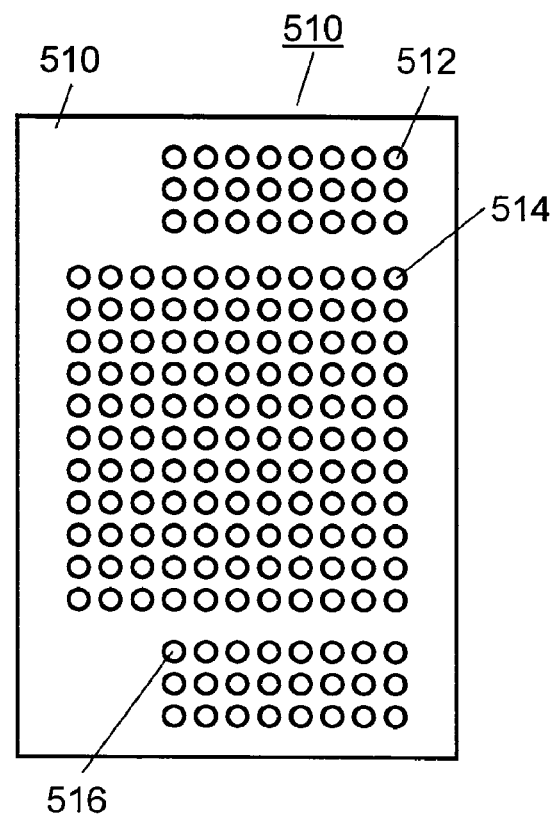
FIG. 6B is a rear view of main body of the socket.

FIG. 4 is a sectional view explaining an internal structure of socket 501 in preferred embodiment 1. FIG. 5A is a top view explaining an outline of lid 502 of socket 501 in preferred embodiment 1. FIG. 5B is a rear view explaining an outline of lid 502 of socket 501 in preferred embodiment 1. FIG. 6A is a top view explaining an outline of main body 510 of socket 501 in preferred embodiment 1. FIG. 6B is a rear view explaining an outline of main body 510 of socket 501 in preferred embodiment 1.

As shown in FIG. 4, FIG. 5A, FIG. 5B, FIG. 6A, and FIG. 6B, socket 501 in preferred embodiment 1 is composed of lid 502 and main body 510. Module board 102 is enclosed and fixed in hole 519 between lid 502 and main body 510 as shown in FIG. 4. Lid 502 and main body 510 are fixed by means of clamp (not shown) and stored.

Lid 502 is composed of wiring board 500, a plurality of male terminals 503 and 517, a plurality of pin contacts 504 and 506, a plurality of wirings 505 and 507, holding plates 509 and 520, and support plate 508. Male terminals 503 and 517 are collectively called first terminals. Male terminals 503 and 517 are examples of first terminals. Pin contacts 504 and 506 are collectively called first protrusions. Pin contacts 504 and 506 are examples of first protrusions.

Main body 510 is composed of molding part 527, a plurality of female terminals 511 and 515, a plurality of contact terminals 513, a plurality of through-holes 518, a plurality of solder balls 512, 514 and 516, and hole 519. Female terminals 511 and 515 are collectively called second terminals. Female terminals 511 and 515 are examples of second terminals. Contact terminals 513 are collectively called fourth terminals. Contact terminals 513 are examples of fourth terminals. Through-holes 518 are collectively called third terminals. Through-holes 518 are examples of third terminals. Solder balls 512, 514 and 516 are collectively called fifth terminals. Solder balls 512, 514 and 516 are examples of fifth terminals.

Main body 510 is formed of molding part 527 which is an insulating material. The insulating material includes, for example, glass epoxy resin. A plurality of contact terminals 513 is disposed in matrix on the bottom of hole 519 at the upper side of main body 510. A plurality of contact terminals 513 is disposed so as to be opposite to all solder balls 43 of module board 102. Hence, all solder balls 43 and contact terminals 513 of module board 102 are held and fixed in lid 502 by putting module board 102 into hole 519 of main body 510, and are individually connected electrically. A plurality of through-holes 518 is disposed from the downside of a plurality of contact terminals 513 to the reverse side of molding part 527. All through-holes 518 are disposed to be opposite to all contact terminals 513. All through-holes 518 and all contact terminals 513 are held and fixed in lid 502 by putting module board 102 in hole 519 of main body 510, and are individually connected electrically. A plurality of solder balls 514 is disposed at the reverse side of molding part 527 at the downside of a plurality of through-holes 518. All solder balls 514 are disposed to be opposite to all of the plurality of through-holes 518. All solder balls 514 are individually connected electrically to all through-holes 518. A plurality of solder balls 514 is disposed in matrix on the reverse side of main body 510. Solder balls 43 are collectively called sixth terminals. Solder balls 43 are examples of sixth terminals.

Therefore, all solder balls 43 of module board 102 and all solder balls 514 are individually connected electrically when enclosed and fixed by lid 502 by putting module board 102 into hole 519 of main body 510. As a result, solder balls 43 on module board 102, a plurality of contact terminals 513, and solder balls 514 are in same array.

Lid 502 is formed of a wiring board 500 made of insulating material. The insulating material may be glass epoxy resin or the like. Wiring board 500 has a conductive wiring layer. The wiring layer may be formed of a copper thin film or the like formed on the surface of the insulating material. In FIG. 4, wiring board 500 has three layers of insulating material and three layers of wiring layer. The number of wiring layers is not limited to three, and it may be formed of one layer, or two or four or more layers.

A plurality of pin contacts 504 is protrusions disposed in matrix at the reverse side of lid 502. A plurality of pin contacts 504 is disposed so as to be opposite to all terminals for inspection 42 of module board 102. Hence, all terminals for inspection 42 and all pin contacts 504 of module board 102 are individually connected electrically when held and fixed by lid 502 by putting module board 102 in hole 519 of main body 510. Holding plate 509 is formed of an insulating material such as glass epoxy resin. Holding plate 509 may be also formed to cover except for the leading end of pin contacts 504. That is, holding plate 509 is penetrated by pin contact 504 and is formed to cover at least a part of lid 502. By the stress caused by fixing or detaching by enclosing with lid 502 by putting module board 102 into hole 519 of main body 510, breakage of pin contact 504 by bending or folding is prevented. Since the leading end of pin contact 504 is not covered, the electrical connection with terminal for inspection 42 is maintained. A plurality of male terminals 503 is terminals disposed in matrix at the reverse side of lid 502. A plurality of male terminals 503 is disposed at the outer side from a plurality of pin contacts 504. A plurality of male terminals 503 is provided opposite to all pin contacts 504. All corresponding male terminals 503 and pin contacts 504 are connected electrically by mans of wiring 505. Wiring 505 is formed by using any one wiring layer of wiring board 500.

In FIG. 5A and FIG. 5B, only three of a plurality of wirings 505 are shown representatively, but actually all male terminals 503 and all pin contacts 504 are connected electrically by means of wiring 505.

A plurality of female terminals 511 is terminals disposed in matrix at the upside of main body 510. A plurality of female terminals 511 is disposed at the reverse side of molding part 527. A plurality of female terminals 511 is provided opposite to all of a plurality of male terminals 503 of lid 502. All female terminals 511 of main body 510 and all male terminals 503 of lid 502 are disposed at the outside of lid 519 of main body 510. Hence all female terminals 511 of main body 510 and all male terminals 503 of lid 502 are individually connected electrically when enclosed and fixed by lid 502 by putting module board 102 in hole 519 of main body 510. A plurality of solder balls 512 is terminals disposed at the reverse side of molding part 527 at the downside of a plurality of female terminals 511. All solder balls 512 are disposed to as to be opposite to all of a plurality of female terminals 511. All solder balls 512 are individually connected electrically to al female terminals 511.

Therefore, all terminals for inspection 42 and all solder balls 512 of module board 102 are individually connected electrically when held and fixed by lid 502 by putting module board 102 into hole 519 of main body 510. That is, by using socket 501 of the present invention, the signal of terminal for inspection 42 provided on the upside of module board 102 is distributed to the reverse side of module board 102. That is, in the inspection system, the signal of terminal for inspection 42 on the upside of module board 102 can be handled same as the signal of solder ball 43. As a result, solder ball 512 is disposed outside of solder ball 514.

The array of male terminals 503 is preferred to be same as the array of corresponding pin contacts 504. By arranging in the same array, the wiring length of all wirings 505 may be set shorter and equal to each other. Since the wiring length is short and equal, the inductive load and capacitive load of individual terminals for inspection 42 may be small and equal. As a result, waveform distortion of signals of terminals for inspection 42 can be suppressed ultimately, and fluctuations can be suppressed, and the precision of inspection can be enhanced. The diameter or pitch of male terminals 503 and female terminals 511 may be desired to be larger than the diameter of pin contacts 504. The diameter or pitch of pin contacts 504 must be adjusted to the diameter of terminals for inspection 42, but it is not required in male terminals 503 and female terminals 511. Hence, male terminals 503 and female terminals 511 may be increased in the diameter or pitch as far as possible, and the contact area is increased, and the connection strength of lid 502 and main body 510 is increased. Preferably, the diameter or pitch of pin contacts 504 should be sufficiently smaller as compared with the diameter or pitch of contact terminals 513. It is because the pitch between terminals for inspection 41 and 42, and the diameter of terminals for inspection 41 and 42 can be set sufficiently smaller as compared with the pitch of solder balls 43 or the diameter of solder balls 43. By sufficiently reducing the diameter or pitch of pin contacts 504, the required area can be reduced.

By using support plate 508, it is desired to adjust the fitting state of connection parts. The thickness of support plate 508 is adjusted so that all solder balls 43, all contact terminals 513, all through-holes 518, all terminals for inspection 42, all pin contacts 504, all female terminals 511, and all of the plurality of male terminals 503 may be connected electrically when held and fixed with lid 502 by putting module board 102 in hole 519 of main body 510. In FIG. 4, the thickness of support plate 508 is a positive value, but may be defined in a negative value if formed to penetrate through wiring board 500.

A plurality of male terminals 517, a plurality of pin contacts 506, a plurality of wirings 507, holding plate 520, a plurality of female terminals 515, a plurality of solder balls 516, and terminals for inspection 43 are same as a plurality of male terminals 503, a plurality of pin contacts 504, a plurality of wirings 505, holding plate 509, a plurality of female terminals 511, a plurality of solder balls 512, and terminals for inspection 42, and the explanation is omitted.

Figure 7:
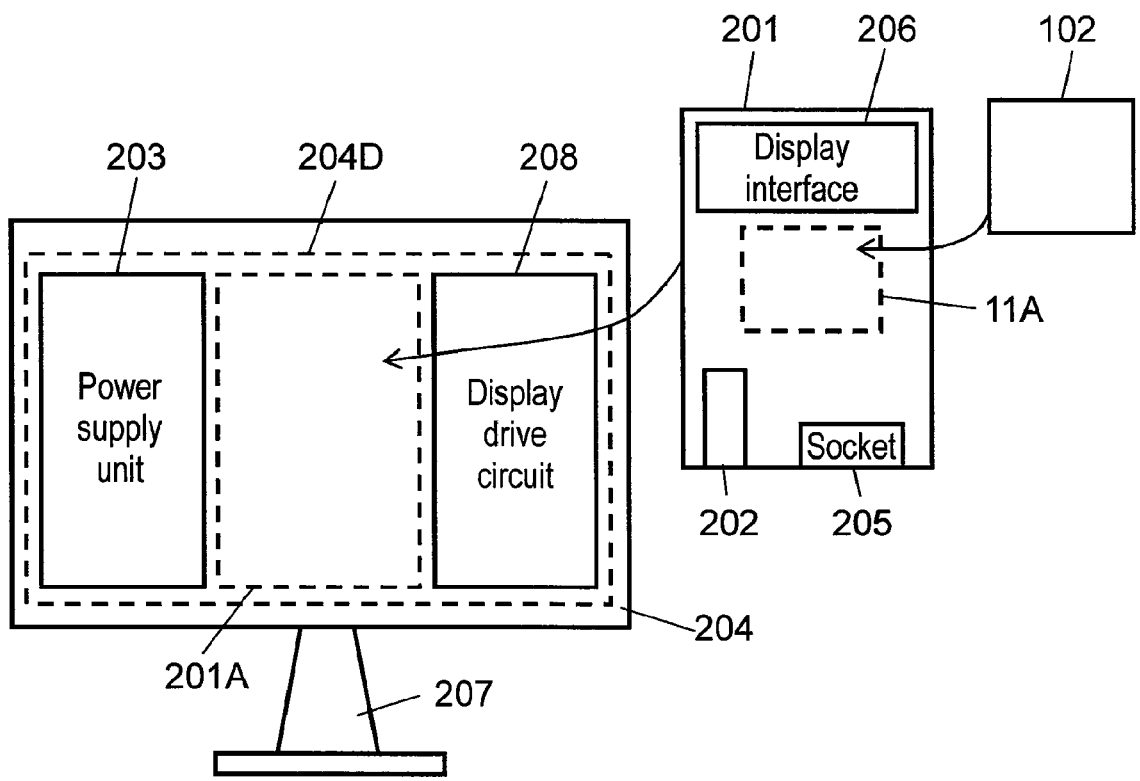
FIG. 7 is a partially exploded mounting view of mounting the module board of preferred embodiment 1 of the present invention on an external board, and manufacturing a product of a television receiver.

FIG. 7 is a partially exploded view for mounting a television receiver for mounting module board 102 in preferred embodiment 1 of the present invention on external board 201, and installing external board 201 in receiving casing 204. This is an example of mounting module board 102 in preferred embodiment 1, mounting display 204D such as liquid crystal display or plasma display, and realizing a product of television receiver. FIG. 7 is a rear view, and display 204D is mounted on the face side as seen as the reverse side in FIG. 7. In this case, module board 102 is a module for realizing a television receiver. That is, LSI 32 is a system LSI having a decoding function for receiving a television signal and issuing a video signal or an audio signal. Module board 102 in other television, receiver for example, a set-top box, a portable terminal, or a PC may be installed in the television receiver. Not limited to the television receiver, the present invention may be applied to other digital electric household appliances.

In FIG. 7, module board 102 is mounted on external board 201 provided with tuner 202 in every nation or every district, socket 205 for connecting with CA module in every market, and display interface 206 for issuing digital audio signal, analog audio signal, and digital video signal (contents signals containing audio and video). Display interface 206 is an interface for connecting the video signal and audio signal issued from module board 102 to a display such as liquid crystal display, plasma display, or CRT display. Display interface 206 is realized by different circuits depending on the connection specification of the display side. The audio signal is issued to a speaker (not shown) displayed inside or outside of the display. External board 201 has a plurality of lands corresponding to the layout of a plurality of solder balls 43 of module board 102, and external board 201 and module board 102 are connected electrically and physically in reflow process. External board 201 to which module board 102 is connected is assembled in a casing of television receiver 204 supported by support stand 207, together with power supply unit 203 and display drive unit 208. Display interface 206 is connected to display 204D by way of display drive circuit 208.

In FIG. 7, module board 102 for television receiver is mounted on position 11A of external board 201 formed of a dielectric board, and external board 201 is installed in position 201A of receiver casing 204.

By preparing external board 201 having lands corresponding to solder balls 43 of module board 102, it can be connected to module board 102, and a product of television receiver is realized.

Terminals for inspection 41 and terminals for inspection 42 are terminals for inspection of module board 102, and are terminals not necessary for the television receiver. The lands corresponding to terminals for inspection 41 and terminals for inspection 42 are not provided in external board 201. That is, external board 201 saves the area required for mounting module board 102 by the portion of terminals for inspection 41 and terminals for inspection 42. Therefore, the television receiver is reduced in size.

Further, terminals for inspection 41 and terminals for inspection 42 are in open state. It is hence possible to save extra inductive load or capacitive load for connecting terminals for inspection 41 and terminals for inspection 42 to external board 201. In other words, it is possible to suppress the waveform distortion of address signal, clock signal, and data signal transferred between LSI 32 and memories 33 and 34, and operation at high speed is realized. Therefore, the television receiver is enhanced in performance.

Figure 8:
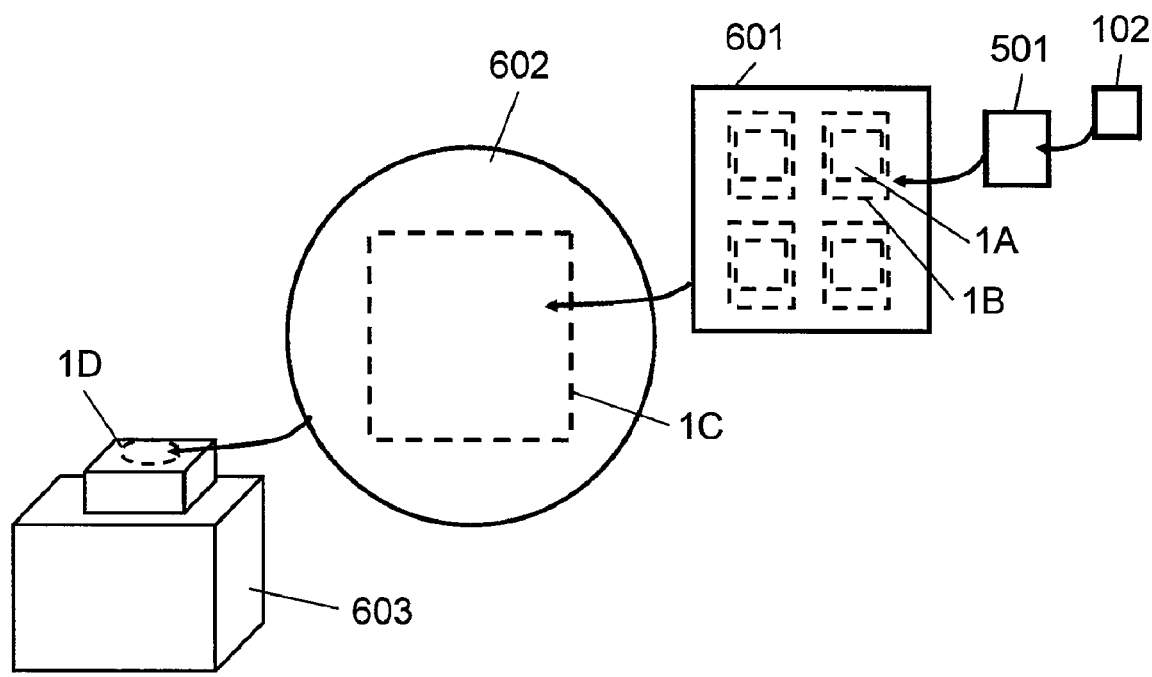
FIG. 8 is a partially exploded mounting view of an inspection system of putting the module board of preferred embodiment 1 of the present invention into the socket in preferred embodiment 1, mounting the socket on an evaluation board, and connecting to an inspection apparatus.

FIG. 8 is a partially exploded mounting view of inspection system in preferred embodiment 1. In this inspection system, module board 102 of preferred embodiment 1 is mounted on socket 501 of preferred embodiment 1, and socket 501 is mounted on evaluation board 601. Evaluation board 601 is connected inspection board 602, and inspection board 602 is connected to inspection apparatus 603. In FIG. 8, module board 102, socket 501, evaluation board 601, and inspection board 602 are seen in top view, and inspection apparatus 603 is seen in outline perspective view.

Inspection apparatus 603 is an apparatus for judging conforming pieces and defective pieces when manufacturing module board 102, and it is a kind of semiconductor tester. It is installed in the inspection process of a factory of a manufacturer for manufacturing and shipping module boards 102. For example, LSI tester or memory tester may be used.

Inspection apparatus 603 is connected to terminals for inspection 41 and 42 of module board 102, and inspects the waveform and pattern of data signals transferred between LSI 32 and memories 33 and 34 in module board 102. When inspecting the internal circuits of LSI 32 and memories 33 and 34, inspection signals are entered from terminals for inspection 41 and 42, and the signals issued from terminals for inspection 41 and 42 are matched with expected values.

Evaluation board 601 is provided with a plurality of lands corresponding to the layout of a plurality of solder balls 512, 514, and 516 of socket 501, and evaluation board 601 and socket 501 are connected physically and electrically in reflow process. The land corresponding to solder ball 514 is formed at position 1A of evaluation board 601, and the lands corresponding to solder balls 512 and 516 are formed outside of position 1A and inside of position 1B of evaluation board 601. Up to four sockets 501 can be mounted on evaluation board 601. It is intended to inspect four module boards 102 in batch. The number of sockets 501 is an example, and is not limited to four.

In FIG. 8, module board 102 for television receiver is stored in socket 501 mounted at position 1B of evaluation board 601 formed of a dielectric board, and evaluation board 601 is connected to inspection board 602, and is connected at position 1C of inspection apparatus 603. Evaluation board 601 is a printed circuit board, and a wiring layer of conductor such as copper is formed on a dielectric material, and wiring by using the wiring layer is possible. Signals necessary for inspection of module board 102 are wired so as to be connected electrically to connectors (not shown) mounted on the reverse side of evaluation board 601 from the lands corresponding to the layout of solder balls 512, 514, and 516. Evaluation board 601, inspection board 602, and inspection apparatus 603 are connected electrically by connectors from them. The explanation of connectors is omitted because, in the actual inspection system, evaluation board 601 and inspection board 602 are integral with inspection apparatus 603, and they can be detached by means of the connectors.

The inspection system is composed of socket 501, evaluation board 601, inspection board 602, and inspection apparatus 603, and module board 102 and inspection apparatus 603 are connected, and module board 102 can be inspected.

Terminals for inspection 41 and terminals for inspection 42 are terminals for inspection of module board 102, and they are terminals necessary for inspection of module board 102. However, terminals for inspection 41 and terminals for inspection 42 are not prepared in solder balls 43 at the reverse side of module board 102. Without using socket 501 in preferred embodiment 1, when module board 102 is mounted on evaluation board 601, it is mounted at position 1A of evaluation board 601. In this case, terminals for inspection 41 and terminals for inspection 42 are open, and cannot be connected electrically to inspection apparatus 603. On the other hand, by using socket 501 of preferred embodiment 1, when module board 102 is mounted on socket 501, terminals for inspection 41 and terminals for inspection 42 are connected electrically to solder balls 512 and 516 at the reverse side of socket 501 by way of pin contacts 504 and 506, wirings 505 and 507, male terminals 503 and 517, and female terminals 511 and 515 of socket 501. Hence, socket 501 is mounted at position 1B of evaluation board 601, and module board 102 is stored, and hence not only solder balls 43 of module board 102, but also terminals for inspection 41 and terminals for inspection 42 can be connected electrically to inspection apparatus 603. As a result, the inspection signals of waveform and pattern of data signals transferred between LSI 32 and memories 33 and 34 in module board 102 can be propagated to inspection apparatus 603, and can be inspected. Or when inspecting the internal circuits of LSI 32 and memories 33 and 34, inspection signals from inspection apparatus 603 can be propagated, and inspection signals from terminals for inspection 41 and 42 are entered, and the signals issued from terminals for inspection 41 and 42 can be matched with expected values.

In module board 102 of preferred embodiment 1, terminals for inspection 41 and 42 are provided on second board 12.

External board 201 of the television receiver in preferred embodiment 1 does not require lands corresponding to terminals for inspection 41 and 42, and the area required for mounting module board 102 can be saved for the area of terminals for inspection 41 and 42. Extra board for forming terminals for inspection is not needed. Hence module board 102 is reduced in size, and the television receiver is reduced in size.

Moreover, terminals for inspection 41 and terminals for inspection 42 are not connected to external board 201 and are in open state. It is hence possible to save extra inductive load or capacitive load added by connecting to external board 201. That is, it is possible to suppress waveform distortions of address signal, clock signal, and data signal transferred between LSI 32 and memories 33 and 34, and operation at high speed is realized. As a result, the television receiver is enhanced in performance.

In the inspection system using socket 501 of preferred embodiment 1, when module board 102 is stored in socket 501, terminals for inspection 41 and terminals for inspection 42 of module board 102 can be connected electrically to inspection apparatus 603. As a result, the waveform and pattern of data signals transferred between LSI 32 and memories 33 and 34 in module board 102 can be inspected. Further defective electronic components in module board 102 can be detected securely. Moreover, when inspecting the internal circuits of LSI 32 and memories 33 and 34, inspection signals are entered from terminals for inspection 41 and 42, and signals issued from terminals for inspection 41 and 42 can be matched with expected values.

Thus, the lands corresponding to terminals for inspection 41 and 42 of module board 102 are necessary in evaluation board 601 in a factory of manufacturer for manufacturing and chipping module board 102, and are not needed in external board 201 of a product using module board 102. Therefore, module board 102 in preferred embodiment 1 can decrease the number of lands necessary for the board after shipping from the manufacturer's factory, and the area for mounting can be saved. That is, module board 102 of the preferred embodiment is effective to reduce the size after shipping from the manufacturer's factory by using socket 501 of the preferred embodiment. While reducing the size, a sufficient inspection is enabled, and increase of the manufacturing cost is prevented, and the cost is reduced, the electronic components can be inspected securely, and the quality is enhanced at the same time.

As mentioned herein, a plurality of male terminals 503 and 517 correspond to the first terminals, a plurality of pin contacts 504 and 506 corresponds to the first protrusions, holding plates 509 and 520 correspond to the holding plates, a plurality of female terminals 511 and 515 corresponds to the second terminals, a plurality of contact terminals 513 corresponds to the fourth terminals, a plurality of solder balls 512 and 516 corresponds to the third terminals, a plurality of solder balls 514 corresponds to the fifth terminals, a plurality of solder balls 43 corresponds to the sixth terminals, holes 519 correspond to the holes, and evaluation board 601 correspond to the evaluation board. However, the present invention is not limited to these examples alone.

Preferred Embodiment 2

Preferred embodiment 2 of the present invention is described below while referring to the drawings. Same elements as in preferred embodiment 1 are identified with same reference numerals, and the detailed description is omitted.

Figure 9:
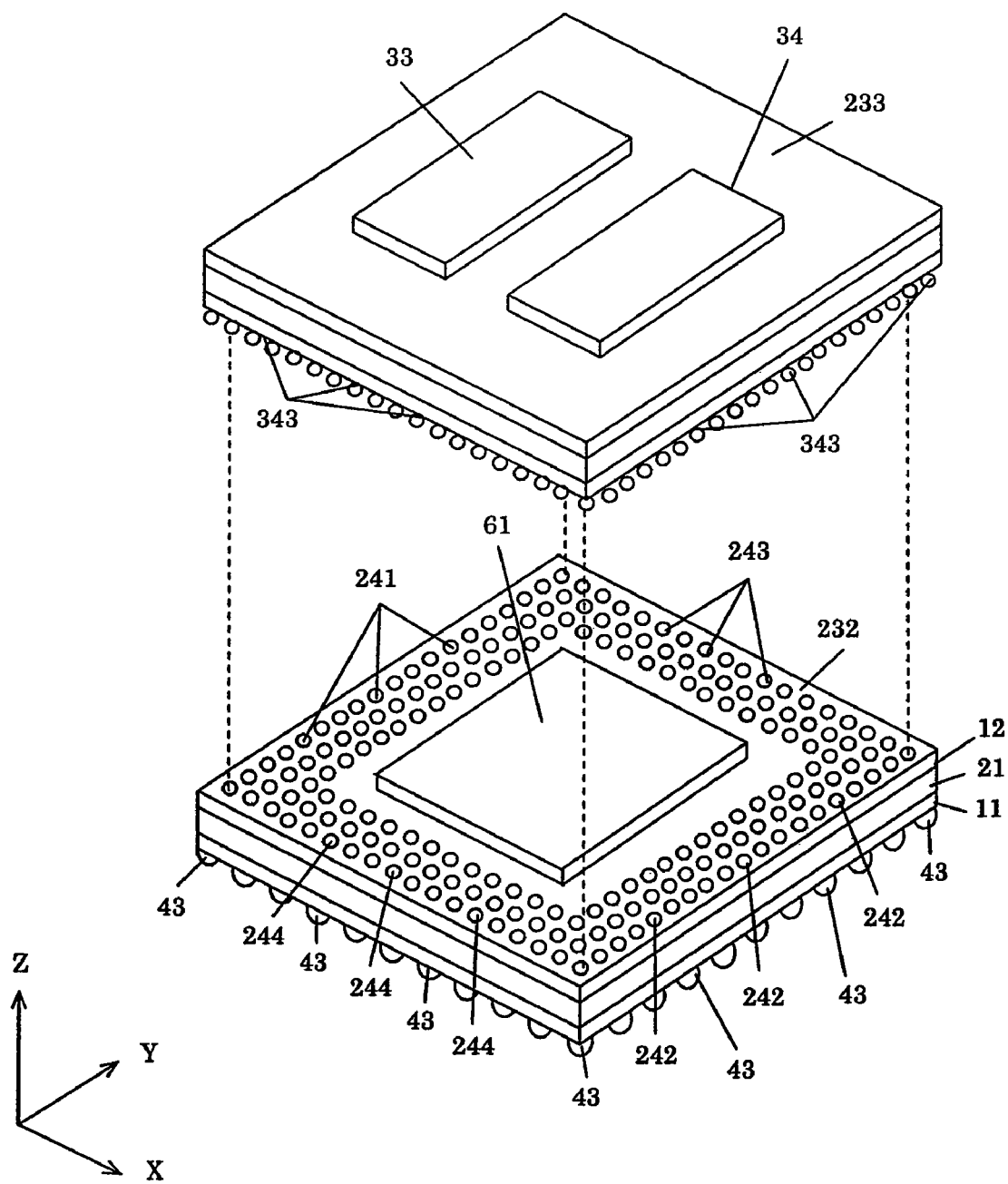
FIG. 9 is a perspective outline view of a module board in preferred embodiment 2.
Figure 10A:
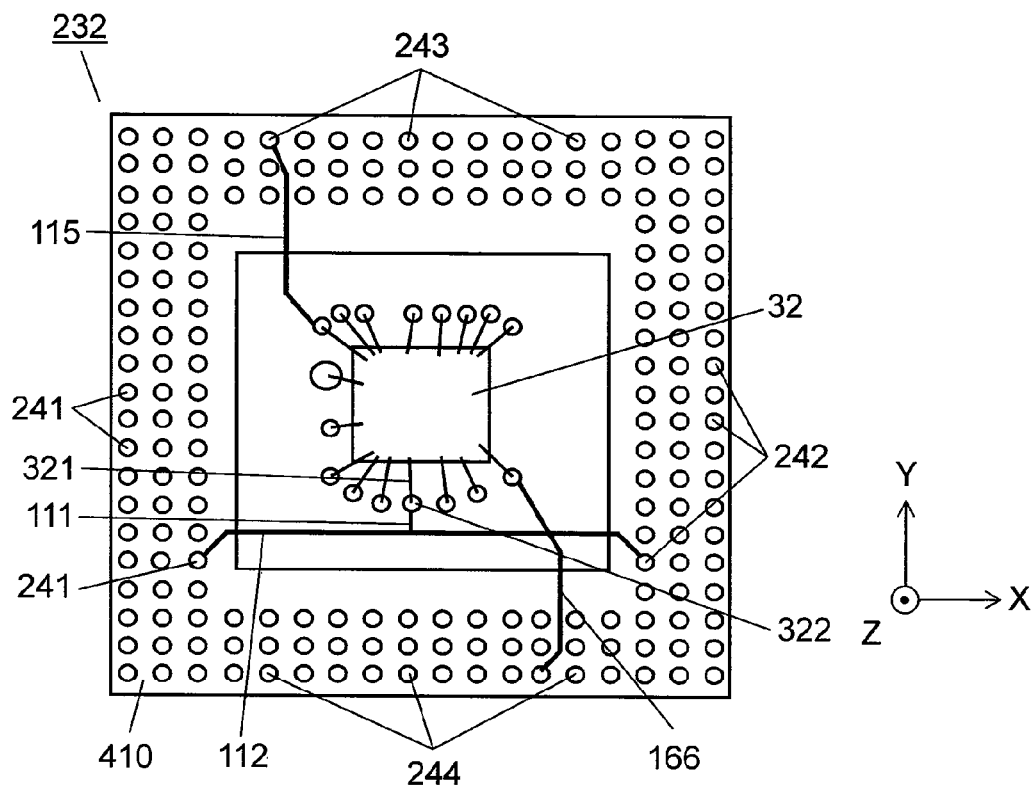
FIG. 10A is a diagram explaining an internal structure of the module board.
Figure 10B:
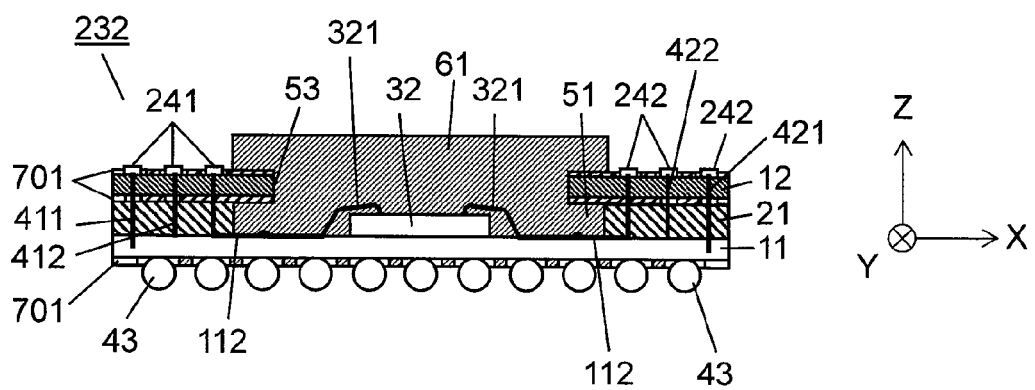
FIG. 10B is a sectional view explaining an internal structure of the module board.

FIG. 9 is a perspective outline view of a module board in preferred embodiment 2. In FIG. 9, to clarify the relation of positions, arrows are shown to indicate mutually orthogonal X-direction, Y-direction, and Z-direction. Specifically, the X-direction and the Y-direction are mutually orthogonal in a horizontal plane, and the Z-direction corresponds to the perpendicular direction. The same arrows indicating the X-direction, Y-direction, and Z-direction are shown in FIG. 10A and FIG. 10B.

As shown in FIG. 9, module board 232 in preferred embodiment 2 has a laminated structure sequentially stacking up first circuit board 11, first composite sheet 21, and second circuit board 12. On the upside of second board 12, mold part 61 is formed as a sealing layer. Module board 232 has LSI 32 same as in preferred embodiment 1.

In module board 232, on four sides at the upside of second board 12, a plurality of terminals for inspection 241, a plurality of terminals for inspection 242, a plurality of terminals for inspection 243, and a plurality of terminals for inspection 244 are disposed in a matrix along four sides of module board 232. Terminals for inspection 241, 242, 243, and 244 are collectively called seventh terminals. Terminals for inspection 241, 242, 243, and 244 are examples of the seventh terminals.

Terminals for inspection 241, 242, 243, and 244 are, as described later, connected electrically to electronic components such as LSI mounted on first board 11 by way of wiring pattern. That is, terminals for inspection 241, 242, 243, and 244 are connected electrically to LSI 32. Terminals for inspection 241, 242, 243, and 244 may be realized, for example, by lands. Same as in preferred embodiment 1, inspection apparatus 603 is connected to terminals for inspection 241, 242, 243, and 244 by way of socket 501. In this case, socket 501 is composed of a plurality of pin contacts 504 and 506, a plurality of male terminals 503 and 517, a plurality of wirings 505 and 507, a plurality of female terminals 511 and 515, and a plurality of solder balls 512, 514 and 516, corresponding to terminals for inspection 241, 242, 243, and 244.

Further, as second module board, module board 233 is also connected to terminals for inspection 241, 242, 243, and 244.

In module board 233, same as in module board 232, first circuit board 11, first composite sheet 21, and second circuit board 12 are stacked up sequentially to form a laminated structure. At the upside of first board 11, same memories 33 and 34 as in preferred embodiment 1 are provided. Memories 33 and 34 may be connected to the lands, not shown, on the upside of first board 12 by soldering in reflow process.

Module board 232 and module board 233 are connected by way of terminals for inspection 241, 242, 243, and 244, and the function of module board 101 is realized. That is, terminals for inspection 241, 242, 243, and 244 are both terminals for inspection of module board 232, and terminals for connection of module board 233. In the bottom of module board 233, a plurality of solder balls 343 are formed. Solder balls 343 are connected electrically to individual electronic components mounted on module board 233. That is, memories 33 and 34 and solder balls 343 are connected electrically. Module board 233 is mounted on module board 232 by soldering terminals for inspection 241, 242, 243, and 244 by using solder balls 343. As a result, the electronic components mounted on module board 232 and module board 233 are connected electrically. That is, LSI 32 is connected electrically to memories 33 and 34.

Module boards 232 and 233 are realized by LSI, IC, MCM, SIP, etc. The connection of module board 232 and module board 233 may be realized by POP (package-on-package) or the like.

An internal structure of module board 232 is specifically described below.

FIG. 10A is a diagram showing a relation of position on XY plane of a plurality of electronic components mounted on module board 232, and FIG. 10B is a sectional view of module board 232.

As shown in FIG. 10B, space 51 penetrating up and down is formed in the center of first composite sheet 21. In space 51, LSI 32 is mounted on first board 11.

As shown in FIG. 10B, hole 53 is formed in a specified region in the center of second board 12. As shown in FIG. 9, FIG. 10A and FIG. 10B, mold part 61 is formed as a sealing layer for sealing the inside of space 51 and hole 53.

In FIG. 10A and FIG. 10B, LSI 32 is connected electrically to wiring patterns on first board 111 by wire bonding process.

Further, referring to FIG. 11, wiring of LSI 32, memories 33 and 34, and terminals for inspection 241, 242, 243, and 244 is explained.

FIG. 11 is a schematic view of wiring patterns 111 to 116 formed on the second board of module board 233 from first board 111 of module board 232 by way of terminals for inspection 241, 242, 243, and 244 and solder balls 343. Wiring patterns 113 and 114 are not provided in preferred embodiment 2. In FIG. 10A, wiring patterns 111 to 116 are represented by one pattern each, but actually wiring patterns 111 to 116 are formed of a plurality each.

As shown in FIG. 11, one end of a plurality of wiring patterns 111 is connected electrically to a plurality of terminals of LSI 32 by way of a plurality of bonding pads 322 (see FIG. 10A) and a plurality of wires 321 (see FIG. 10A). Other end of a plurality of wiring patterns 111 is connected each to the center of a plurality of wiring patterns 112.

One end of a plurality of wiring patterns 112 is connected electrically to a plurality of terminals of memory 33 by way of terminals for inspection 242. Other end of a plurality of wiring patterns 112 is connected each to a plurality of terminals of memory 34 by way of terminals for inspection 241, terminals for inspection 242.

One end of a plurality of wiring patterns 115 is connected electrically to a plurality of terminals of LSI 32 by way of bonding pads 322 (see FIG. 10A) and wires 321 (see FIG. 10A). Other end of a plurality of wiring patterns 115 is connected electrically each to a plurality of terminals of memory 33 by way of terminals for inspection 243.

One end of plurality of wiring patterns 116 is connected electrically to a plurality of terminals of LSI 32 by way of bonding pads 322 (see FIG. 10A) and wires 321 (see FIG. 10A). Other end of a plurality of wiring patterns 116 is connected electrically each to a plurality of terminals of memory 34 by way of terminals for inspection 244.

Although not shown in the drawing, power source signals necessary for operation of memories 33 and 34 are also connected to the second board of module board 233 from first board 11 of module board 232 by way of terminals for inspection 241, 242, 243, and 244 and solder balls 343.

In this configuration, address signals and clock signals are transferred from LSI 32 to memories 33 and 34 by way of wiring patters 111 and 112 and terminals for inspection 241 and 242. Data signals are transferred from LSI 32 to memories 33 and 34 by way of wiring patters 115 and 116 and terminals for inspection 243 and 244.

Herein, wiring patterns 111, 112, 115, and 116 are functionally wirings not required except for connecting between LSI 32 and memories 33 and 34. That is, the wirings for connecting LSI 32 and memories 33 and 34 are functionally enough only with wiring patterns 111, 112, 115, and 116 for transferring the signals. Incidentally, wiring patterns 111, 112, 115, and 116 are not connected to solder balls 43. That is, LSI 32 and memories 33 and 34 and wiring patterns 111, 112, 115, and 116 have no extra wiring, and are closed within module board 232 and module board 233.

In the case of POP of preferred embodiment 2, alternatively, module board 232 and module board 233 are inspected individually, and module board 232 and module board 233 are connected, and then further inspected. Thus, by inspecting them before and after connection, only conforming pieces can be connected to each other, and the defective rate of completed products after inspection can be lowered.

In individual inspection of module board 232, to inspect the waveform and pattern of all signals transferred from LSI 32 to memories 33 and 34, inspection apparatus 603 mentioned below must be connected to all wiring patterns 111, 112, 115, and 116 of module board 232. To inspect the waveform and pattern of all signals transferred from LSI 32 to memories 33 and 34, means for realizing the function of memories 33 and 34 is required. In this case, inspection apparatus 603 may have the function of memories 33 and 34, or the function of memories 33 and 34 may be provided on socket 501 of evaluation board 601 or inspection board 602. That is, inspection apparatus 603 may be provided with software for emulating memories 33 and 34, or inspection apparatus 603, or evaluation board 601 or inspection board 602 or socket 501 may be provided with functions of memories 33 and 34. By connecting these memory functions and module board 232, signals are transferred from LSI 32 to memories 33 and 34, and the waveform and pattern of the transferred signals can be inspected.

To inspect the internal circuits for connecting memories 33 and 34 of LSI 32 in module board 232, inspection signals from inspection apparatus 603 outside of module board 232 are put into LSI 32, and the signals issued from LSI 32 must be matched with expected values.

In preferred embodiment 2, as explained in FIG. 10A, FIG. 10B, and FIG. 11, terminals for inspection 241 and 242 and wiring patterns 111 and 112 are connected electrically. Hence, by connecting inspection apparatus 603 to terminals for inspection 241 or 242, the waveform and pattern of address signals and clock signals transferred from LSI 32 to memory 33 can be inspected.

Further, terminals for inspection 243 and wiring patterns 115 are connected electrically. Hence, by connecting inspection apparatus 603 to terminals for inspection 243, the waveform and pattern of data signals transferred between LSI 32 and memory 33 can be inspected.

Moreover, terminals for inspection 244 and wiring patterns 116 are connected electrically. Hence, by connecting inspection apparatus 603 to terminals for inspection 244, the waveform and pattern of data signals transferred between LSI 32 and memory 34 can be inspected.

To inspect the internal circuits for connecting memories 33 and 34 of LSI 32, terminals for inspection 241, 242, 243, and 244, and inspection apparatus 603 are connected. As a result, inspection signals are entered in terminals for inspection 241, 242, 243, and 244, and the signals issued from terminals for inspection 241, 242, 243, and 244 are matched with expected values.

In module board 232 in preferred embodiment 2, terminals for inspection 241, 242, 243, and 244 are provided on second board 12.

Since external board 201 of the television receiver in preferred embodiment 2 does not require the lands corresponding to terminals for inspection 241, 242, 243, and 244, the area required for mounting a completed product connecting module board 232 and module board 233 can be saved by the portion of the area required for terminals for inspection 241, 242, 243, and 244. As a result, the television receiver is reduced in size.

Further, terminals for inspection 241, 242, 243, and 244 also function as connection terminals for connecting module board 232 and module board 233. It hence eliminates extra connection terminals for connecting to external board 201, or extra inductive load or capacitive load added for wiring to inspection terminals. That is, the waveform distortion of address signal, clock signal and data signal transferred between LSI 32 and memories 33 and 34 can be suppressed, and operation at high speed is realized. As a result, the television receiver is enhanced in performance.

In the inspection system for using socket 501 in preferred embodiment 2, when module board 232 is stored in socket 501, generation of reflection wave can be prevented in terminals for inspection 241 and terminal for inspection 242 of module board 232. Hence, waveform distortion in signals of wiring patterns can be prevented.

Further, terminals for inspection 241, 242, 243, and 244 and inspection apparatus 603 can be connected electrically. Or, inspection apparatus 603 may be provided with software for emulating memories 33 and 34, or inspection apparatus 603, or evaluation board 601 or inspection board 602 or socket 501 may be provided with functions of memories 33 and 34. As a result, it is possible to inspect the waveform and pattern of all data signals transferred between LSI 32 and memories 33 and 34 in module board 232. Or when inspecting the internal circuits of LSI 32, inspection signal are entered from terminals for inspection 241, 242, 243, and 244, and the signals issued from terminals for inspection 241, 242, 243, and 244 are matched with expected values. As a result, the waveform and pattern of all data signals transferred between LSI 32 and memories 33 and 34 in module board 232 can be inspected and matched with expected values, so that the quality of module board 232 may be enhanced.

Thus, the lands corresponding to terminals for inspection 241, 242, 243, and 244 of module board 232 must be provided in evaluation board 601 in a factory of a manufacturer for manufacturing and shipping module boards 232, but are not required in external boards 201 of products using completed products connecting module board 232 and module board 233.

Hence, in module board 232, the number of lands necessary for the board is saved after shipping from the manufacturer's factory, and the area required for mounting is saved. That is, by using the inspection system provided with socket 501 conforming to preferred embodiment 2, module board 232 may be reduced in size after shipping from the manufacturer's factory. As a result, sufficient inspection can be done while reducing in size, and increase of manufacturing cost is suppressed, and the cost is reduced and electronic components can be inspected securely, and hence the quality is enhanced.

INDUSTRIAL APPLICABILITY

The module board and socket of the invention, and the inspection system using them can be reduced in size after inspecting and shipping from the manufacturer's factory. The module board and socket of the invention, and the inspection system using them are hence very useful as a system for inspecting the module board on which electronic components are mounted, the socket for storing the module board, and the electronic components.

The invention claimed is:
1. A socket comprising:
   a lid having a first protrusion on its reverse side, and a first terminal connected electrically to the first protrusion; and
   a main body having a second terminal on its upside, and a third terminal connected electrically to the second terminal on its reverse side,
   wherein the first terminal and the second terminals are disposed opposite to each other;

wherein the main body has a hole for storing a module board which is a subject to be inspected on its upside;
wherein the hole has a fourth terminal at its bottom;
wherein a fifth terminal at a reverse side of the main body connected electrically to the fourth terminal;
wherein the first protrusion is disposed inside of the hole;
wherein the first terminal and the second terminal are disposed outside of the hole;
wherein the module board is contained in the main body, and the first terminal and the second terminal are connected electrically in a space enclosed and fixed by the lid;
wherein the first protrusion is connected electrically with a first terminal for inspection exposed on an upside of the module board; and
wherein the fourth terminal is connected electrically with a second terminal for inspection disposed on a downside of the module board.

2. The socket of claim 1, wherein a diameter or a pitch of the first protrusion is smaller than a diameter or pitch of the fourth terminal.

3. The socket of claim 2, wherein a diameter of the first terminal is larger than a diameter of the first protrusion.

4. A module board comprising:
a plurality of circuit boards laminated in a vertical direction and having individual wiring patterns;
an electronic component mounted on at least one circuit board of the plurality of circuit boards and connected electrically to the wiring patterns;
a sixth terminal provided at a downside of the lowest circuit board of the plurality of circuit boards, and connected electrically to the wiring patterns; and
a seventh terminal exposed on an upside of the highest circuit board of the plurality of circuit boards, and connected electrically to the wiring patterns,
wherein the seventh terminal serves as a connection terminal for laminating a second module board, and also is a first terminal for inspection of a socket, and wherein the first terminal for inspection is connected with a first protrusion,
wherein the socket comprises:
  a lid having the first protrusion on its reverse side, and a first terminal connected electrically to the first protrusion; and
  a main body having a second terminal on its upside, and a third terminal connected electrically to the second terminal on its reverse side,
wherein the first terminal and the second terminals are disposed opposite to each other;
wherein the main body has a hole for storing a module board which is a subject to be inspected on its upside;
wherein the hole has a fourth terminal at its bottom;
wherein a fifth terminal at a reverse side of the main body connected electrically to the fourth terminal;
wherein the first protrusion is disposed inside of the hole;
wherein the first terminal and the second terminal are disposed outside of the hole;
wherein the module board is contained in the main body, and the first terminal and the second terminal are connected electrically in a space enclosed and fixed by the lid;
wherein the first protrusion is connected electrically with a first terminal for inspection exposed on an upside of the module board; and
wherein the fourth terminal is connected electrically with a second terminal for inspection disposed on a downside of the module board.

5. The module board of claim 4,
wherein at least one electronic component of the electronic components is sealed.

6. The module board of claim 4,
wherein a space is formed in the plurality of circuit boards, and at least one electronic component out of the electronic components is disposed in the space.

7. The module board of claim 5,
wherein a space is formed in the plurality of circuit boards, and at least one electronic component out of the electronic components is disposed in the space.

8. An inspection system comprising:
a socket comprising:
  a lid having a first protrusion on its reverse side, and a first terminal connected electrically to the first protrusion; and
  a main body having a second terminal on its upside, and a third terminal connected electrically to the second terminal on its reverse side,
  wherein the first terminal and the second terminals are disposed opposite to each other;
  wherein the main body has a hole for storing a module board which is a subject to be inspected on its upside;
  wherein the hole has a fourth terminal at its bottom;
  wherein a fifth terminal at a reverse side of the main body connected electrically to the fourth terminal;
  wherein the first protrusion is disposed inside of the hole;
  wherein the first terminal and the second terminal are disposed outside of the hole; and
a module board which is a subject to be inspected, the module board comprising:
  a plurality of circuit boards laminated in a vertical direction and having individual wiring patterns;
  an electronic component mounted on at least one circuit board of the plurality of circuit boards and connected electrically to the wiring patterns;
  a sixth terminal provided at a downside of the lowest circuit board of the plurality of circuit boards, and connected electrically to the wiring patterns; and
  a seventh terminal exposed on an upside of the highest circuit board of the plurality of circuit boards, and connected electrically to the wiring patterns,
  wherein the seventh terminal is the first terminal for inspection of the socket, the first terminal for inspection is connected with the first protrusion, and also serves as a connection terminal for laminating a second module board,
  wherein the module board is contained in the main body, and the first terminal and the second terminal are connected electrically in a space enclosed and fixed by the lid;
wherein a first protrusion is connected electrically to the seventh terminal;
the fourth terminal is connected electrically to the sixth terminal;
an electric signal of any one of the module board and the electric component is propagated from the third terminal and the fifth terminal.

* * * * *